US006775811B2

(12) United States Patent
Lakshmanan et al.

(10) Patent No.: US 6,775,811 B2
(45) Date of Patent: Aug. 10, 2004

(54) CHIP DESIGN METHOD FOR DESIGNING INTEGRATED CIRCUIT CHIPS WITH EMBEDDED MEMORIES

(75) Inventors: Viswanathan Lakshmanan, Westminster, CO (US); Michael Josephides, Louisville, CO (US); Tom R. O'Brien, Ft. Collins, CO (US); David A. Morgan, Ft. Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 105 days.

(21) Appl. No.: 10/151,826

(22) Filed: May 22, 2002

(65) Prior Publication Data

US 2003/0221177 A1 Nov. 27, 2003

(51) Int. Cl.⁷ .............................................. G06F 17/50
(52) U.S. Cl. ................................ 716/10; 716/8; 716/9; 716/11; 716/5; 716/1; 714/718; 714/727; 714/733; 714/734
(58) Field of Search ......................... 716/1–18; 714/30, 714/718, 726, 727, 733, 734; 703/14–16

(56) References Cited

U.S. PATENT DOCUMENTS

| | | | | |
|---|---|---|---|---|
| 5,551,013 A | * | 8/1996 | Beausoleil et al. | 703/23 |
| 6,370,677 B1 | * | 4/2002 | Carruthers et al. | 716/8 |
| 6,456,961 B1 | * | 9/2002 | Patil et al. | 703/14 |
| 6,564,305 B1 | * | 5/2003 | Moore | 711/154 |
| 2003/0115564 A1 | * | 6/2003 | Chang et al. | 716/8 |

* cited by examiner

*Primary Examiner*—Vuthe Siek
(74) *Attorney, Agent, or Firm*—Fitch, Even, Tabin & Flannery

(57) ABSTRACT

A method of circuit design for designing integrated circuits with one or more embedded memories. A placement is generated for timing critical logic associated with each included embedded memory in a logic design. An augmented memory boundary is generated for said each included memory. Each augmented memory boundary encompasses one embedded memory and associated said timing critical logic.

15 Claims, 1 Drawing Sheet

FIG._1A
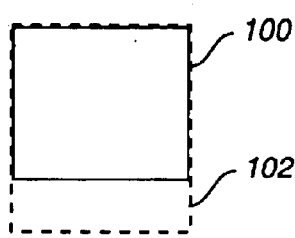
FIG._1B
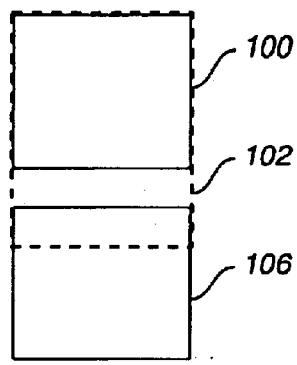
FIG._2
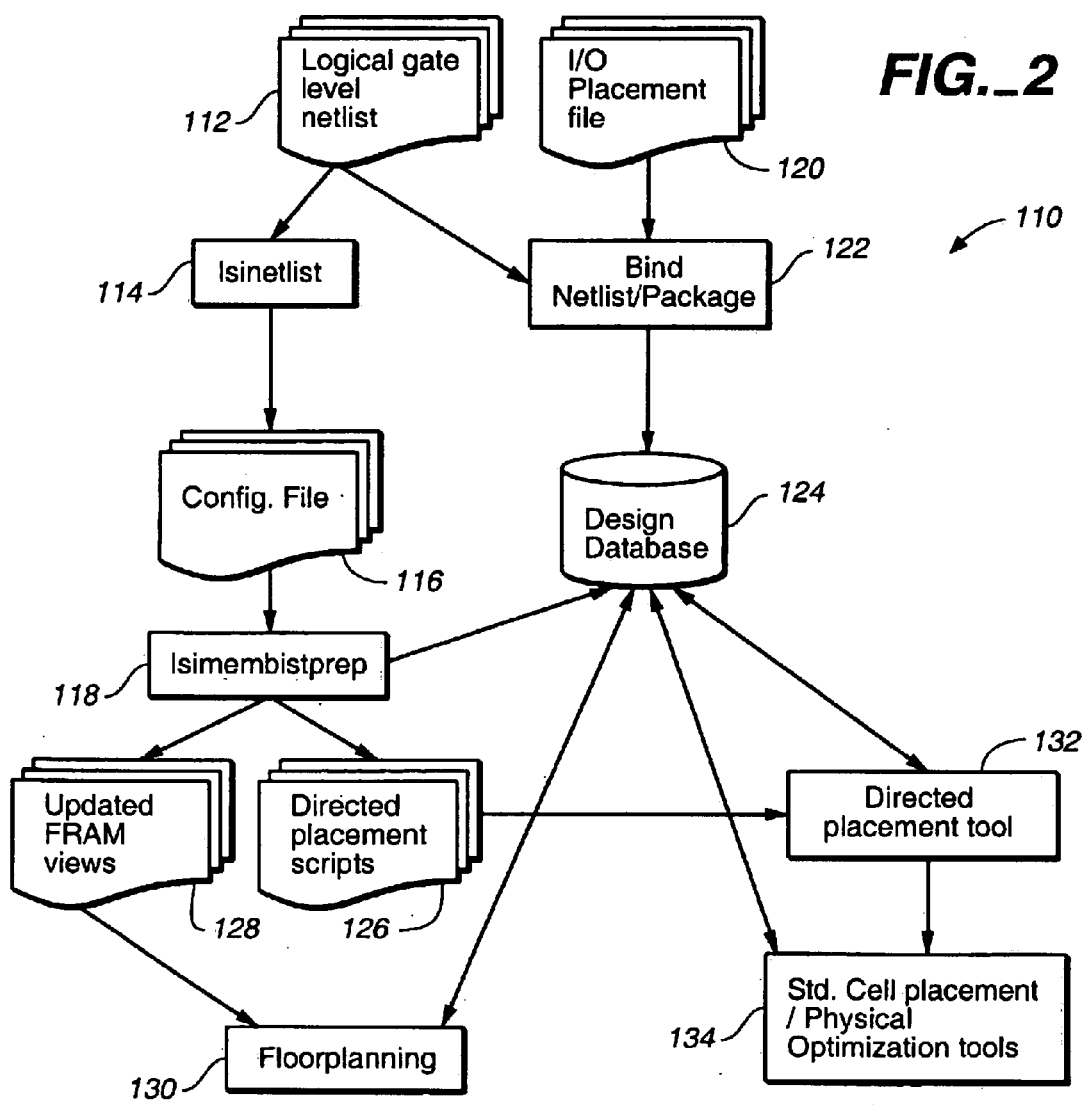

CHIP DESIGN METHOD FOR DESIGNING INTEGRATED CIRCUIT CHIPS WITH EMBEDDED MEMORIES

REFERENCE TO COMPUTER PROGRAM LISTING APPENDIX

The following computer program listing files are submitted on a compact disc and are incorporated herein by reference:

NAME CREATION DATE SIZE (bytes)

AppendixI.txt Aug. 28, 2002 9,773

AppendixII.txt Aug. 28, 2002 10,515

AppendixIII.txt Aug. 28, 2002 835

AppendixIV.txt Aug. 28, 2002 2,147

AppendixV.txt Aug. 28, 2002 15,719

BACKGROUND OF THE INVENTION

1. Field of the Invention

The present invention is related to integrated circuit chips and more particularly to integrated circuit chips including embedded memories.

2. Background Description

Increasingly, integrated circuit chips include embedded memories. Application specific integrated circuits (ASICs) in particular have become more and more complex and, correspondingly, more and more frequently include embedded memory. As technology has advanced and feature size has shrunk, embedded memory granularity (density) has increased. In this trend towards more complex logic on an ASIC with a larger embedded memory both, is driven by and, is driving the effort to integrate a system on a chip (SOC).

Testing an embedded memory on a complex logic chip is a well known problem. Thus, self test logic has been developed for inclusion on the chip to test the embedded memory and is known as built-in self-test (BIST) logic. There are logic tools that are currently available, such as from LogicVision, Inc., which are specifically designed for creating BIST for embedded memories. These logic tools generate a well defined test logic architecture that may be wrapped around an embedded memory. Typically, the embedded memory and the BIST logic are defined with and included in the ASIC logic.

Once ASIC logic is defined, typically, the top level chip definition or the chip footprint is partitioned and space is designated for specific functions. After this partitioning, the square/rectangular chip footprint with areas boxed off for specific functions resembles the floorplan of a building or house. So, this partitioning step is commonly referred to as floorplanning. Likewise other terms normally associated with Realty are used occasionally for chip design. Floor-planning is a very important step of chip design.

If a chip is improperly floorplanned such that insufficient space is allocated for a particular function, it may be necessary to locate part of that function elsewhere on the chip, which would introduce otherwise unanticipated delays. Normally, the ASIC designer attempts to take into account any delays that might be added during placement and wiring. Unfortunately, delay added by splitting a macro or, when associated logic is placed a significant distance from the macro, can blow the designer's timing budgets and may require significant additional post placement analysis and redesign to recover, if recovery is possible at all.

Delays may be added to embedded memory timing from locating BIST logic at some distance to the memory, such that loads on the particular embedded memory are increased, slowing it, i.e., significantly degrading performance. Also, even if the embedded memory performance is not degraded, splitting the BIST logic can give apparent performance times that are much higher than the actual embedded memory performance. In this case even though the embedded memory performs satisfactorily, delays in the BIST logic may necessitate additional design time to improve performance on a memory that, in actuality, is performing satisfactorily.

Thus, there is a need for a way to insure automatically that BIST logic is placed as close as possible to the embedded memories that the logic is intended to test, to minimize any added delay or to avoid any apparent delay that must be separated from the BIST to adequately test the embedded memories.

SUMMARY OF THE INVENTION

It is a purpose of the invention to facilitate testing embedded memories;

It is another purpose of the invention to insure placement of memory self test logic close to the embedded memory that it is testing.

The present invention is a method of circuit design for designing integrated circuits with one or more embedded memories. A placement is generated for timing critical logic associated with each included embedded memory in a logic design. An augmented memory boundary is generated for said each included memory. Each augmented memory boundary encompasses one embedded memory and associated said timing critical logic.

BRIEF DESCRIPTION OF THE DRAWINGS

The foregoing and other objects, aspects and advantages will be better understood from the following detailed preferred embodiment description with reference to the drawings, in which:

FIGS. 1A–B show embedded memory and associated BIST and floorplanning problems;

FIG. 2 is a flow diagram of a preferred embodiment chip design method according to the present invention.

DESCRIPTION OF PREFERRED EMBODIMENTS

Turning now to the drawings and more particularly FIG. 1A shows an example of an embedded memory boundary 100 with a visual boundary 102 augmented by the area necessary for its associated BIST generated according to a preferred embodiment of the present invention. The visual boundary 102 is a rectangular region created to guide the designer during floor-planning to prevent it from encroaching on adjacent memories. Thus, floorplanning with visual boundaries 102 for BIST augmented memories, ensures that there is enough room to place timing critical logic and other necessary logic adjacent to each specific memory instance. Typically during floorplanning, the embedded memory boundary 100 is reserved but room is seldom reserved for logic. In particular, it is important to properly floorplan an integrated circuit chip in order to quickly resolve any timing issues that might arise out of and during placement and wiring. It is well known that to minimize delays between circuits and between macros, it is best to place interacting circuits or macros as close to one another as possible.

Likewise it is important to place logic associated with a particular macro as close to that macro as possible.

FIG. 1B shows an example wherein, a second unaugmented macro 106, e.g., another embedded memory, is placed in the vicinity of embedded memory 100 such that it encroaches on the augmented boundary 102. By virtue of this encroachment insufficient area remains between the memories 100, 106 to place BIST logic for each. In this example, although room is available to place some of the BIST logic between the two macros 100, 106, the available room is not enough. Because no or insufficient space was allocated for the BIST logic, some part of it must be placed elsewhere on the chip with wires run between the logic segments. Thus in this example, the BIST logic, scattered and wired, may not run at speed and so, may be unusable for its intended purpose, i.e., to test the embedded memory macro 100. Further, additional wiring channels are occupied to wire this scattered BIST logic and, additional power is required to drive those wires. Clearly, this example of inefficient floorplanning, uses resources (wiring the channels, drive, etc.) that could be better used elsewhere.

Thus, according to the preferred embodiment of the present invention, area required for the BIST logic is calculated prior to floorplanning and, a floorplanning frame 102 is generated that includes area for BIST with the embedded memory 100. The augmented frame 102 includes both the embedded memory physical model/view 100 and the BIST, which is set aside during floorplanning to allocate sufficient space at the embedded memory 100 for the BIST logic. Thus, for the example of FIG. 1B, a visual boundary or frame would also be generated for memory 106 to prevent the encroachment to either memory 100, 106 such as is apparent in this example. Advantageously, because sufficient space is reserved, the BIST logic may be placed adjacent to or in close proximity to the embedded memory without excessively loading the embedded memory or introducing apparent delays in the measured memory performance.

Preferably, the floorplanning tool of the present invention includes a memory BIST preparation script, e.g., in the Python interactive, object oriented programming language. When the preparation script is invoked, it identifies BIST logic in the design, e.g., an application specific integrated circuit (ASIC) logic design. The identified BIST logic is attached to the appropriate embedded memory and, the embedded memory frame is augmented. So, when the augmented memory frame is placed during floorplanning, sufficient space is allocated for both the embedded memory and the appurtenant BIST logic.

An example script and associated subscripts are included in Appendices I–V, with the main Python script in Appendix I labeled MembistPrep in this example. The primary script invokes subscripts, one of which, MembistBndry in Appendix II for this example, creates a visual boundary for the memory frame. This visual boundary subscript creates a scheme file that invokes a prep subscript, membistPrep.scm in Appendix III for this example, that defines helper functions for creating the visible boundary. This prep subscript invokes an exception subscript, MembistException in Appendix IV for this example, that is a module and defines an exception class and may include error messages for reporting errors. The exception subscript also invokes a trace subscript, membistTraceFunc in Appendix V for this example, that traces logical connectivity of timing critical cells associated with the memory.

Thus, the primary script traces the logic connectivity of the critical logic timing sort by invoking the trace subscript and creates a file or writes trace results to an existing file that is used later in the design flow, e.g., for timing analysis or for placement and wiring. The trace subscript facilitates identifying BIST logic at memory inputs and outputs by querying the embedded memory boundary, port by port and interrogating each port to identify connected logic. Then, as each connected logic block or cell is identified, that logic cell is listed for placement with the embedded memory and the boundary is expanded or augmented to include the area for that identified cell, provided that cell is not already been included in logic listed for the expanded or augmented boundary. The trace subscript continues to identify cell instances for the BIST logic that remain outside the augmented boundary. The boundary script creates a visual augmented boundary that aids the designer in determining an optimal, efficient floorplan. As logic connected to the augmented embedded memory inputs and outputs (I/O's) is identified, the augmented boundary is sized to accommodate the identified logic. The trace subscript also does fanout analysis on the BIST logic.

FIG. 2 is a flow diagram 110 of a preferred embodiment chip design method according to the present invention, which facilitates floorplanning, especially, floorplanning for BIST in chips with embedded memories. Essentially, the preferred method includes two major pre-floorplanning steps. First, using the above-described Python script file, for example, a placement script is generated for timing critical logic associated with embedded memory inputs/outputs. Then, the particular embedded memory boundary is expanded by adding area for the BIST logic to generate an augmented embedded memory boundary. A prep script gathers connectivity information for critical cell timing, in particular, for critical cells connected to the memory inputs and outputs from a gate level structural design description or netlist, e.g., an Avant! database. The prep script formats the information with appropriate syntax into a functional file (e.g., Isimembistprep-func.da) for a connectivity based selective logic placement tool such as Columbia from Avant! Corporation. The logic tool reads the placement directed file and performs appropriate cell preplacement to augment memory with identified timing critical BIST logic. The augmented memory boundary or visual boundary (e.g., 102 of FIGS. 1A–B) provides a visual cue to assist the designer in finding an optimal floorplan for a design. Then, other macros are placed and logic design proceeds normally.

So, according to the preferred embodiment of the present invention, each embedded memory is identified and, any associated BIST for that memory is likewise identified. Then, in pre-floorplanning preparation, an initial visual boundary is created and expanded appropriately to contain identified timing critical BIST logic and other relevant logic. Floorplanning is then performed using the visual boundary to aid in optimally placing the memory macros. In a post-floorplan phase the BIST logic is placed adjacent to the embedded memory at appropriate input/output locations. The embedded memory boundary is expanded for that placed logic such that when the expanded boundary or augmented boundary is placed, the memory and all of its associated BIST logic is placeable within that augmented boundary. The logic and embedded memory may be placed when the augmented boundary is placed or, optionally, the logic and embedded memory may be placed in the augmented boundary, subsequent to floorplanning in a normal place and wire step.

So, in the first step 112 of the flow diagram of 110, the logical gate level netlist file is passed to a net list tool 114 that creates a configuration file 116 with the memory macro names used by the MembistPrep tool 118. The logical gate level netlist file 112 along with the Input/Output (I/O) placement file 120 is used in the Bind netlist/Package 122 to create a physical abstract for the incoming netlist. A physical data equivalent is stored in the design database 124, e.g., an Avant! database. The MembistPrep tool 118 gathers the memory instances from a configuration file 116. The gathered memory instances are used to identify and trace timing critical logic to each memory input or output; generate directed placement scripts 126 for the identified timing critical logic; and, create the visual boundary 128. As additional timing critical logic is identified, the directed placement scripts 126 and physical abstract views 128 of the memories are updated with the visual boundary information by the MembistPrep tool 118.

In step 130, the designer can use the visual boundary information to optimize the design floorplan. After floorplanning a directed placement tool 132 is used to pre-place the logic, identified by the directed placement scripts, adjacent to the specific memories. Then, in step 134 standard cell placement may be done using a typical state of the art placement tool, e.g., the placement lsimps tool from LSI Logic Corporation. As with any design, physical optimization is performed on the placement until all necessary design parameters are satisfied.

While the invention has been described in terms of preferred embodiments, those skilled in the art will recognize that the invention can be practiced with modification within the spirit and scope of the appended claims.

What is claimed is:

1. A method of circuit design for designing integrated circuits including one or more embedded memories comprising step of:
   a) identifying built-in self-test logic associated with an embedded memory;
   b) generating an augmented memory boundary prior to floorplanning that encompasses a boundary of the embedded memory and the associated built-in self-test logic; and
   c) allocating space for the augmented memory boundary during floorplanning.

2. A method as in claim 1 wherein step a) comprises:
   i) gathering connectivity information for timing critical logic at inputs and outputs of the embedded memory; and
   ii) pre-placing the timing critical logic at the inputs and outputs of the embedded memory.

3. A method as in claim 2 further comprising steps of:
   c) floorplanning the embedded memory and the pre-placed timing critical logic in the integrated circuit design from the augmented memory boundary;
   d) placing the embedded memory at locations identified by the augmented memory boundary; and
   e) placing the timing critical logic in the augmented memory boundary.

4. A circuit design method for designing integrated circuits having at least one embedded memory array comprising steps of:
   a) identifying an embedded memory array in an integrated circuit design;
   b) generating a placement boundary for the embedded memory array;
   c) generating placement for timing critical logic associated with the embedded memory array;
   d) expanding the placement boundary by an area required for the placement of the timing critical logic to form an augmented memory boundary prior to floorplanning; and
   e) placing and wiring the embedded memory array and the timing critical logic for the integrated circuit design in the augmented memory boundary.

5. A circuit design method as in claim 4 wherein design logic for the integrated circuit design is converted into a netlist for a particular design tool and wherein step c) comprises generating a configuration file containing information about included embedded memories and associated timing critical logic.

6. A circuit design method as in claim 5 wherein step c) further comprises applying a back-end flow tool to the configuration file and the netlist.

7. A circuit design method as in claim 6 wherein the augmented memory boundary is generated by adding an area sufficient for placing the timing critical logic adjacent I/Os of the embedded memory array.

8. A circuit design method as in claim 7 wherein the augmented memory boundary is visually displayable for manual placement.

9. A circuit design method as in claim 8 wherein the timing critical logic is pre-placed with the embedded memory array.

10. A circuit design method for designing an integrated circuit having at least one embedded memory array comprising seeps of:
    a) identifying any embedded memory array in timing critical logic that has a placement boundary;
    b) generating placement for timing critical built-in self-test (BIST) logic;
    c) expanding the placement boundary of any identified embedded memory array by an area determined to be required for BIST logic related to the embedded memory array to form an augmented memory boundary; and
    d) placing and wiring logic for the integrated circuit wherein the augmented memory boundary is placed to locate the embedded memory array and BIST logic associated with the embedded memory array.

11. A circuit design method as in claim 10 wherein step b) comprises:
    i) converting design logic into a netlist for a particular design tool; and
    ii) generating a configuration file containing information about included embedded memory arrays and associated BIST.

12. A circuit design method as in claim 11 wherein step b) further comprises:
    iii) applying a back-end flow tool to said configuration file and the netlist.

13. A circuit design method as in claim 12 wherein the augmented memory boundary is generated by adding an area corresponding to the timing critical BIST logic to a corresponding embedded memory array area.

14. A circuit design method as in claim 13 wherein the augmented memory boundary is visually displayable for manual placement.

15. A circuit design method as in claim 14 wherein the timing critical BIST logic is pre-placed with the embedded memory array.

* * * * *